United States Patent [19]

Ellul et al.

[11] Patent Number: 5,275,974
[45] Date of Patent: Jan. 4, 1994

[54] METHOD OF FORMING ELECTRODES FOR TRENCH CAPACITORS

[75] Inventors: Joseph P. Ellul, Nepean; John M. Boyd; Michael B. Rowlandson, both of Ottawa, all of Canada

[73] Assignee: Northern Telecom Limited, Montreal, Canada

[21] Appl. No.: 921,667

[22] Filed: Jul. 30, 1992

[51] Int. Cl.⁵ .......................................... H01L 21/62
[52] U.S. Cl. ................................ 437/203; 437/919; 257/535
[58] Field of Search ............... 437/47, 60, 67, 203, 437/208, 919; 148/DIG.; 257/301, 303, 532, 520, 535, 621

[56] References Cited

U.S. PATENT DOCUMENTS

| | | |
|---|---|---|
| 4,577,395 | 3/1986 | Shibata . |
| 4,833,094 | 5/1989 | Kenney . |
| 4,905,065 | 2/1990 | Selcuk et al. . |

FOREIGN PATENT DOCUMENTS

| | | | |
|---|---|---|---|
| 53-147477B | 12/1978 | Japan | 251/520 |
| 59-150465 | 8/1984 | Japan | 437/919 |
| 62-279655 | 12/1987 | Japan | 437/919 |
| 63-287054 | 11/1988 | Japan . | |
| 1-65862 | 3/1989 | Japan | 437/919 |
| 1-192164 | 8/1989 | Japan | 437/919 |
| 9011619 | 10/1990 | PCT Int'l Appl. . | |

OTHER PUBLICATIONS

"Depletion Trench Capacitor Technology for Megabit Level MOS DRAM", T. Morie et al IEEE El. Dev Lett, vol. EDL-4, No. 11, Nov. 1983.
"A 4.2 um2 half-Vcc Sheath Plate Capacitor DRAM Cell with Self-aligned Buried Plate-Wiring" T. Kaga et al, IEDM, 87-328 (1987).
"Double-Stacked Capacitor with Self-Aligned Poly Source-Drain Transistor (DSP) Cell for Megabit DRAM", K. Tsukamoto et al, IEDM, 87-328 (1987).
"Process Technologies for High Density, High Speed 16 Megabit Dynamic Ram", F. Horiguchi et al., IEDM, 87-324 (1987).

*Primary Examiner*—George Fourson
*Attorney, Agent, or Firm*—Angela C. de Wilton

[57] ABSTRACT

A method is provided for forming electrodes of a trench capacitor for an integrated circuit in which the number of mask levels is reduced. The method is compatible with CMOS and Bipolar CMOS processes. After defining a trench in a substrate by a conventional photoengraving step and anisotropic etching, successive conformal layers of a first dielectric layer, a first conductive layer, and subsequent conformal dielectric layers and conformal conductive layers are deposited to fill the trench. The resulting structure is planarized, preferably by chemical-mechanical polishing to provide fully planarized topography. Each of the conductive layers form an electrode. Coplanar areas of each of the conductive layers are exposed within the trench for formation of contacts to the electrodes. Advantageously, the trench has a wide portion and a narrow portion of smaller lateral dimension. The narrow portion of the trench is filled by the first conductive layer and after planarization provides an area of sufficiently large dimension for forming a contact to the first electrode. Contact to the second electrode is made in the first portion of the trench. Thus multiple electrodes for a trench capacitor are defined by a maskless process.

20 Claims, 10 Drawing Sheets

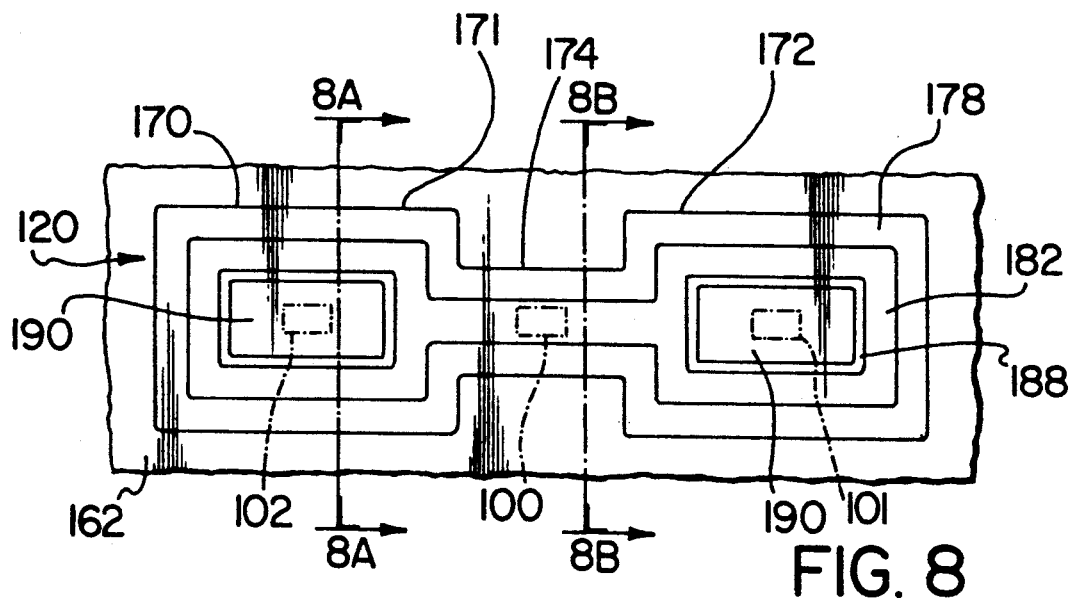
FIG. 8
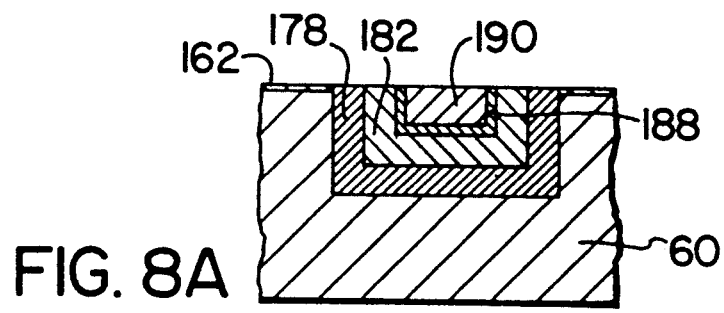
FIG. 8A
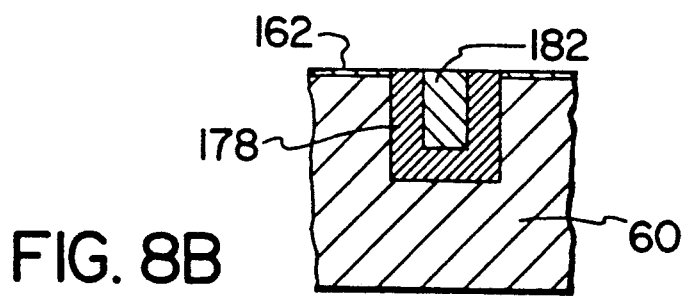
FIG. 8B
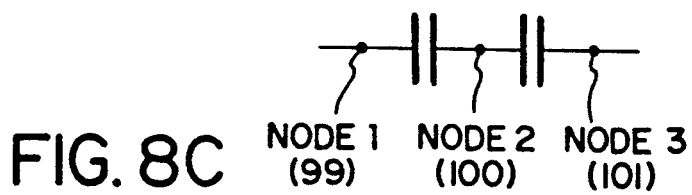
FIG. 8C  NODE 1 (99)  NODE 2 (100)  NODE 3 (101)

METHOD OF FORMING ELECTRODES FOR TRENCH CAPACITORS

FIELD OF THE INVENTION

This invention relates to electrodes for trench capacitor structures, and a method of forming electrodes of a trench capacitor structure for an integrated circuit.

BACKGROUND OF THE INVENTION

Trench capacitors with one or more polysilicon electrodes for silicon integrated circuits may be fabricated using known methods, and have applications in Structures such as DRAMs (Dynamic Random Access Memories) and analog circuits. Typically, the number of masking steps required depends on the number of polysilicon electrodes. For example, in forming a simple trench capacitor having one polysilicon electrode, in which the silicon substrate acts as the other electrode, a conventional known method includes steps of:
1. patterning and etching a trench in a silicon substrate;
2. formation of a capacitor dielectric on trench walls and bottom, typically silicon dioxide;
3. filling of the trench with polysilicon by a known method of chemical vapour deposition (CVD) to provide the polysilicon electrode; and
4. planarization by removal of the surface substantially back to the level of the substrate surface.

The width of the trench polysilicon must be of such a dimension to allow a contact to be made by a method known in the industry. The resulting capacitor is formed between a deposited top polysilicon electrode and the silicon substrate. One masking step is required for patterning and etching the trench. Depending on the method of contact formation, another masking step may be required for defining a contact area to the substrate.

A known method for providing a capacitor having two polysilicon electrodes includes the steps of:
1. patterning and etching a trench in a silicon substrate;
2. forming an insulating dielectric layer on sidewalls and a bottom of the trench;
3. deposition and planarization of a first layer of polysilicon within the trench by a known method of CVD;
4. patterning and etching a second trench within the first polysilicon layer to form sidewalls of the first polysilicon layer in the trench to serve as one of the capacitor electrodes;
5. forming a layer of a capacitor dielectric on the etched first polysilicon layer;
6. filling the resulting dielectric lined trench inside the first polysilicon layer with a second polysilicon layer by a known method of CVD; and
7. planarization of the second polysilicon level with the substrate and first polysilicon surfaces.

Thus, a first masking step is required for defining the trench in the substrate (step 1) and a second masking step is required (step 4) for defining a second trench within the first polysilicon layer. The width of the second polysilicon within the second trench must be such as to allow a contact to be made by methods known in the industry. Depending on the method of contact formation, another masking step may be required for formation of a contact to the second polysilicon layer. Hence a minimum of two masking steps are required for formation of a trench linear capacitor with two polysilicon electrodes, one each for the trench and at least one polysilicon electrode.

SUMMARY OF THE INVENTION

The present invention seeks to provide electrodes for a trench capacitor structure for an integrated circuit and a method of forming electrodes for a trench capacitor structure in which the number of masking steps is reduced.

Thus, according to the present invention there is provided a method of forming electrodes of a trench capacitor structure for an integrated circuit, comprising: providing a substrate having a planar surface and defining therein a trench, the trench having sidewalls and a bottom; providing a conformal first dielectric layer extending over sidewalls and bottom of the trench; providing a conformal first conductive layer overlying the first dielectric layer within the trench; providing a conformal second dielectric layer overlying the first conductive layer within the trench; providing an overlying conformal second conductive layer within the trench; and planarizing the resulting structure by removal of each of said dielectric layers and conductive layers extending above the planar surface of the substrate, to expose substantially coplanar surfaces of each layer within the trench.

Thus the present invention provides a method of forming a plurality of trench isolated electrodes of a capacitor structure for an integrated circuit which requires only one mask level for engraving the trench. Two or more self-aligned electrodes are formed from conformal layers of conductive material and dielectric material within the trench. Since each layer is conformal and thus effectively self-aligned within the trench, successive layers conform to the contour of the trench defining the first layer, and photomasking steps for defining each conductive layer are not required. After filling of the trench with a selected number of conformal conductive layers and intervening conformal dielectric layers, a single planarization step removes each layer extending above the substrate surface. Thus contact areas to each conductive layer are exposed level with the surface of the substrate.

Advantageously, in forming a capacitor structure having two electrodes, the trench has a first, wide portion and a narrow portion of smaller lateral dimension, and the step of providing a first conductive layer fills the narrow portion of the trench and leaves a cavity within the first portion of the trench. The second dielectric layer and the second conductive layer fill the cavity within the first portion of the trench. Thus two differently filled regions of the trench are provided, the narrow portion of the trench providing a contact area for the first conductive layer which forms a lower electrode, and the wider portion of the trench filled with subsequent layers of dielectric and conductive layers. After planarization, the exposed surface of the first conductive layer in the narrow portion of the trench has a lateral width of twice the thickness of the first conductive layer, sufficiently large for formation thereon of a contact, and similarly, a contact area to the second conductive layer is provided in the wide portion of the trench. Hence formation of first and second electrodes for a trench linear capacitor is achieved in a maskless process sequence. Furthermore, a resulting structure which has substantially coplanar contact areas simplifies the formation of contacts to each electrode by a conventional known method.

Preferably, the planar surface of the substrate comprises a protective layer of chemical-mechanical polish (CMP)resistant material and the step of planarizing comprises chemical-mechanical polishing to provide a fully planarized topography, although other suitable planarization methods may be used. Consequently, coplanar contact areas are provided to each conductive layer, and topography related problems are reduced in subsequent processing steps.

According to another aspect of the present invention there is provided a method of forming trench isolated electrodes of a capacitor structure for an integrated circuit, comprising: providing a substrate having a planar surface defining therein a trench having sidewalls and a bottom, the trench having a first portion and a narrower portion of smaller lateral dimension; providing a conformal layer of dielectric material over sidewalls and the bottom of the trench, the dielectric layer leaving a cavity within the trench; providing a conformal layer of a conductive material overlying the dielectric layer the thickness of the conductive layer being sufficient to completely fill narrow portions of the trench and a part of said cavity remaining unfilled in the first portion of the trench; filling the trench by providing within the trench subsequent conformal layers comprising at least an other conformal dielectric layer and an overlying conformal conductive layer; and planarizing the resulting structure by removal of material of the dielectric layer and of the conductive layer and subsequent conformal layers extending above the planar surface of the substrate to expose surfaces of each of said layers within the trench substantially coplanar with the substrate surface whereby each conductive layer forms one of a plurality of trench isolated electrodes.

Thus, in forming a capacitor having a plurality of electrodes, after providing a second dielectric layer and a second conductive layer which partially fills the cavity within the first portion of the trench and before planarizing the resulting structure, another conformal layer of dielectric and another conformal layer of conductive material is provided, thereby filling the cavity within the trench and forming a third trench isolated electrode. Thus multiple electrodes may be provided within the trench without additional masking steps, each subsequent conformal layer of conductive material forming an electrode aligned within the cavity defined by the underlying conformal layers.

According to another aspect of the present invention there is provided a method of forming electrodes of a trench linear capacitor for an integrated circuit comprising: providing a substrate having a planar surface and defining therein a trench having sidewalls and a bottom, the trench having a first portion and a narrow portion of smaller lateral dimension; providing a conformal first dielectric layer extending over sidewalls and the bottom of the trench; providing a conformal first conductive layer overlying the first dielectric layer, the first conductive layer being sufficiently thick so that the narrow portion of the trench is completely filled with the first conductive layer, and part of said cavity remains in the first portion of the trench; providing a conformal second dielectric layer overlying the first conductive layer in said cavity; providing a conformal second conductive layer over the second dielectric layer, the second conductive layer being sufficiently thick to fill said cavity remaining in the trench; and planarizing the resulting structure by removal of layers extending above the planar surface of the substrate, to expose substantially coplanar surfaces of the first and second conductive layers, the first and second conductive layers thereby providing trench isolated first and second electrodes, and the exposed surfaces of the second conductive layer in the first portion of the trench and of the first conductive layer in the narrow portion of the trench thereby providing planarized areas sufficiently large for defining electrical contacts thereon.

Thus, in forming of a trench linear capacitor structure with two conductive electrodes, neither of which are the semiconductor substrate, the requirement for a masking step to define the electrode structures is avoided and regions for contacting both conductive electrodes are provided also without the use of a masking step. A single photoengraving (i.e. photolithographic) step is required only for defining the area for etching the trench.

Advantageously, a protective layer is provided on the substrate surface to allow for removing surface layers, preferably by chemical-mechanical polishing, to provide a fully planarized surface with coplanar areas exposed on each conductive layer for formation of first and second electrode contacts.

According to a further aspect of the present invention there is provided a trench capacitor structure for an integrated circuit, comprising: a substrate having a planar surface and defining therein a trench region, the trench region having sidewalls and a bottom, the trench region being filled with a plurality of conformal layers comprising: a conformal first dielectric layer extending over sidewalls and bottom of the trench; a conformal first conductive layer overlying the first conformal dielectric layer, and at least an other conformal dielectric layer overlying the first conductive layer and an overlying conformal conductive layer within the trench; and each of the conductive layers and the dielectric layers having planarized surface areas substantially coplanar with the substrate surface, the planarized surface area of each of the conductive layers being sufficiently large for formation thereon of an electrical contact, the conductive layers thereby forming electrodes isolated from one another within the trench region by a dielectric layer therebetween According to yet another aspect of the present invention there is provided a trench linear capacitor structure for an integrated circuit, comprising: a substrate having a planar surface and defining therein a trench region, the trench region having sidewalls and a bottom, the trench region being filled with layers comprising: a conformal first dielectric layer extending over sidewalls and bottom of the trench; a conformal first conductive layer overlying the first conformal dielectric layer; a second conformal dielectric layer overlying the first conductive layer, and an overlying second conformal conductive layer; and the first and second conductive layers and the first and second dielectric layers each having planarized surfaces substantially coplanar with the substrate surface, the planarized surface areas of each of the first and second conductive layers being sufficiently large for formation thereon of an electrical contact, the first and second conductive layers thereby forming first and second electrodes isolated from one another within the trench region by the second dielectric layer therebetween.

Preferably, in a linear trench capacitor structure having two electrodes, the trench region comprises a first, wider portion and a narrow portion of smaller lateral dimension, the narrow portion of the trench region is filled by layers comprising the first dielectric layer and first conductive layer only, and the wider first portion of the trench is filled also with the second conductive layer and the underlying first dielectric layer. Thus the two portions of the trench are differently filled and the planarized surfaces provide sufficiently large coplanar contact areas for contacts to the first and second electrodes by a conventional known method. Conveniently, a contact to the first electrode is made in the narrow region of the trench and a contact area to the second electrode is made in the first portion of the trench.

Thus, the present invention provides a method of forming trench isolated electrodes of a capacitor structure for an integrated circuit, a method of forming electrodes of a trench linear capacitor, a capacitor structure, and a trench linear capacitor structure using a reduced number of photoengraving or masking steps.

BRIEF DESCRIPTION OF THE DRAWINGS

Embodiments of the invention will now be described by way of example, with reference to the accompanying drawings, in which:

FIG. 8 shows a capacitor divider structure according to a second embodiment of the invention in plan view; FIGS. 8A and 8B cross-sectional views; and FIG. 8C shows an equivalent circuit diagram.

DESCRIPTION OF THE PREFERRED EMBODIMENTS

Figure 1:
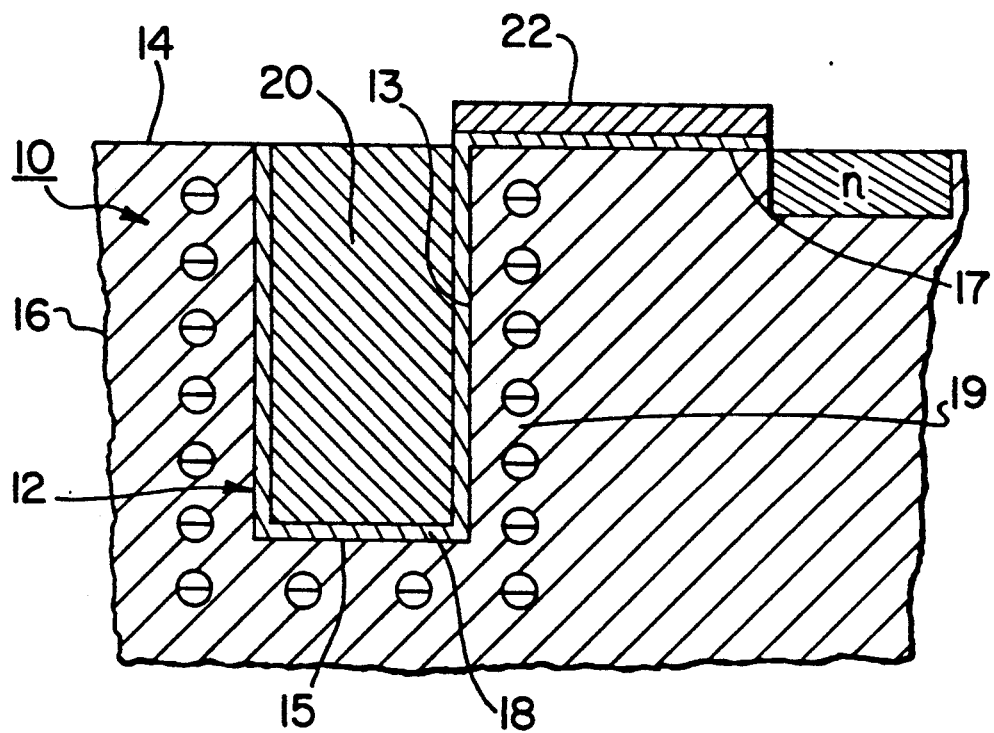
FIG. 1 shows schematically a known prior art polysilicon-to-substrate silicon trench capacitor for a DRAM.

A trench capacitor 10 of known prior art structure is shown in FIG. 1, and comprises a trench 12 defined within a surface 14 of a part of a semiconductor silicon wafer 16 which forms a substrate for an integrated circuit. The trench 12 is formed by selectively masking the surface 14 by a known method, for example, by coating with photoresist and patterning, and then etching a trench 12 by a known method, typically anisotropic reactive ion etching. The resulting trench 12 has steep sidewalls 13. A dielectric layer 18, typically of silicon dioxide, is grown or deposited within the trench 12 so as to extend conformally over the sidewalls 13 and bottom 15 of the trench and over the surface 17 adjacent the trench. A conformal, conductive layer of polysilicon 20 is provided by chemical vapour deposition to fill the remaining volume of the trench to form the top electrode of the charge storage capacitor. The silicon substrate acts as the bottom capacitor electrode, and forms the memory charge storage node. A second layer of conductive polysilicon is deposited to extend over the surface 17 adjacent the trench and is patterned to define a top electrode 22 adjacent the trench. The top electrode 22 electrically connects the N+ diffusion to the substrate capacitor electrode for the purposes of pumping charge for storage according to the wordline potential. Therefore, in the trench to substrate capacitor so formed, stored charge is located as indicated schematically in FIG. 1, at the silicon substrate surface region 19 surrounding the trench 12.

Figure 2:
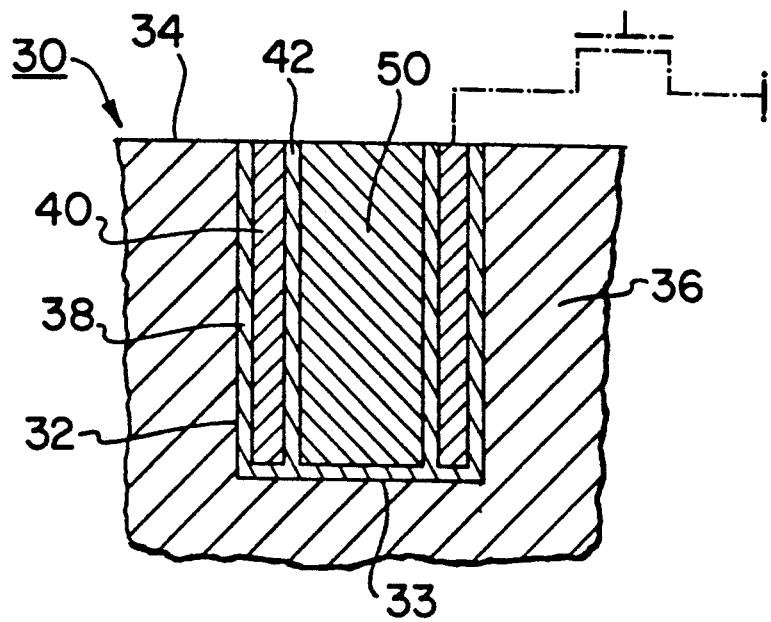
FIG. 2 shows schematically a known prior art structure of a polysilicon-to-polysilicon trench capacitor for a DRAM.

A trench linear capacitor 30 of known structure, having two electrodes 40 and 50, buried inside a trench 32 and isolated from the substrate 36 is shown in FIG. 2. In a known method of forming a capacitor of this structure, a steep-sided trench 32 is provided within the surface 34 of the substrate 36 silicon wafer by a known method of anisotropic ion etching. A first dielectric layer 38 is grown or deposited to line the trench 32 and then a first conductive layer 40 of a conductive material, i.e. doped polysilicon, is deposited overall on the wafer to fill the entire trench. After planarization and removal of excess polysilicon extending over the surface 34, the remaining first polysilicon layer 40 is contained within the trench 32, which is completely filled, and the exposed surface of the polysilicon layer 40 is planar with the silicon surface 34. A second trench is defined by photoengraving, i.e. by coating with photoresist, patterning photo-lithographically, and then etching the second trench within the first polysilicon layer 40, thereby removing the centre region of the first polysilicon, so that only the sidewalls 40 of the original first polysilicon layer remain in the trench 32. These sidewalls 40 form the bottom electrode of the trench capacitor. A second dielectric layer 42 is grown or deposited over the sidewalls 40 and the bottom 33 of the original trench 32. A second conductive polysilicon layer 50 is deposited to completely fill the trench inside the first polysilicon layer and also to coat the entire surface 34 of the substrate 30. After planarization and removal of the excess second layer polysilicon over the surface 39, the structure shown in FIG. 2 is formed. Thus, the trench 32 is filled with layers forming the first dielectric 38, bottom polysilicon electrode 40, second dielectric 42 and top polysilicon electrode 50. Electrode 40 forms the storage node of the capacitor. In this process, at least one of the linear capacitor electrodes 40 and 50, as well as the trench, must be defined photolithographically.

Figure 3:
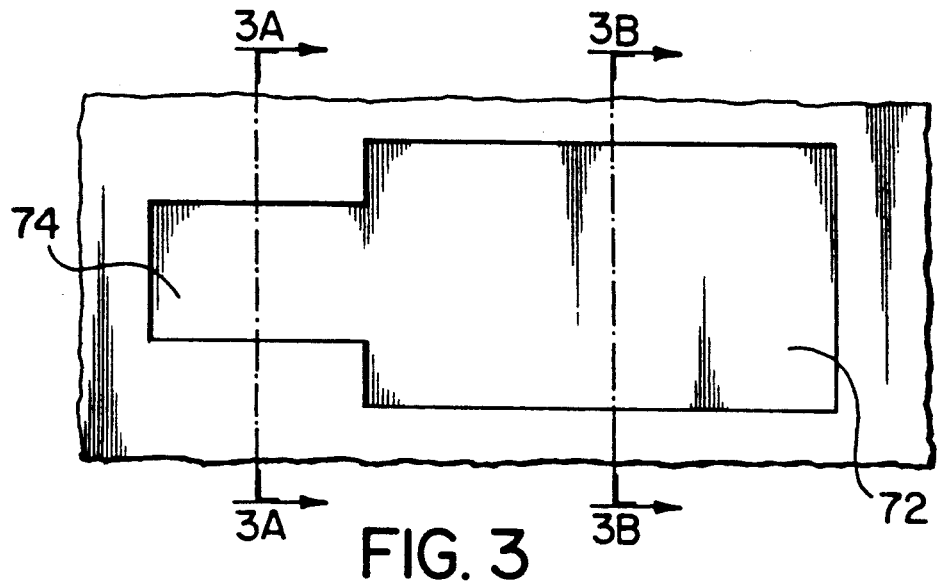
FIG. 3 shows a structure in plan view.
Figure 3A:
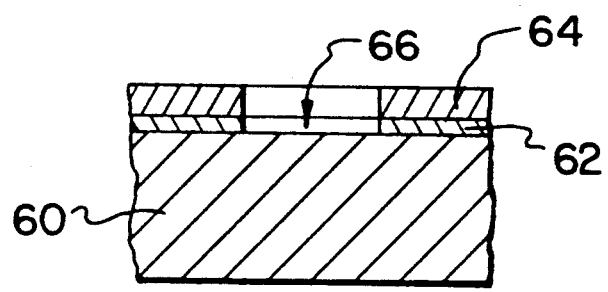
FIGS. 3A and 3B show respectively first and second cross-sectional views, at a process step in a method of forming a trench linear capacitor according to a first embodiment of the invention.
Figure 3B:
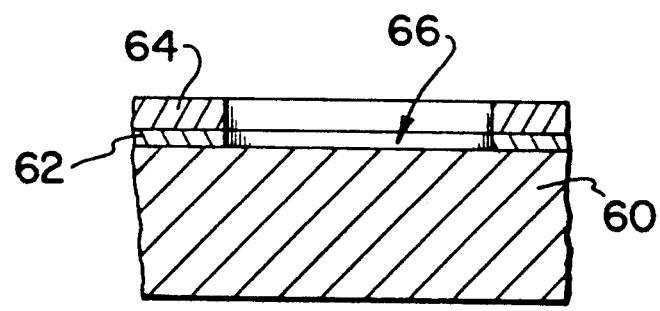

In a method of forming a trench linear capacitor structure 55 (FIG. 7C) for an integrated circuit according to a first embodiment of the present invention, as shown schematically in each part of FIGS. 3 to 7, which shows part of a silicon wafer 60 forming a substrate for an integrated circuit. A coating of a first masking layer 62, comprising for example silicon nitride, is deposited to serve as a chemical-mechanical polish stop layer, as will be described below. Then, a coating of a second masking layer 64, for example silicon dioxide, is grown or deposited thereon to serve as a trench etch mask. The two masking layers 62 and 64 are patterned photo-lithographically and engraved as shown in FIG. 3b by a method known in the industry, so as to expose a selected area 66 of the underlying surface of the substrate 60 for defining and etching a trench 70. As shown in FIG. 3, from the top plan view of the area 66, the trench 70 has a first wider portion 72 and a second relatively narrow portion 74. The lateral dimensions of the wider portion 72 and narrower portion 74 are parameters which influence the capacitance of the resulting trench capacitor 55.

Figure 4:
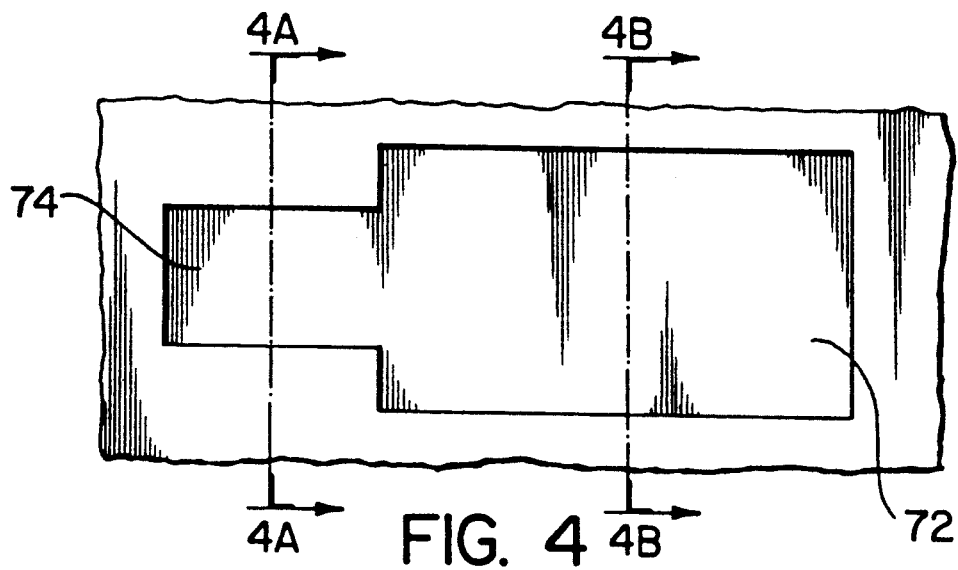
FIGS. 4 to 7 show the structure as in FIG. 3 in plan view.
Figure 4A:
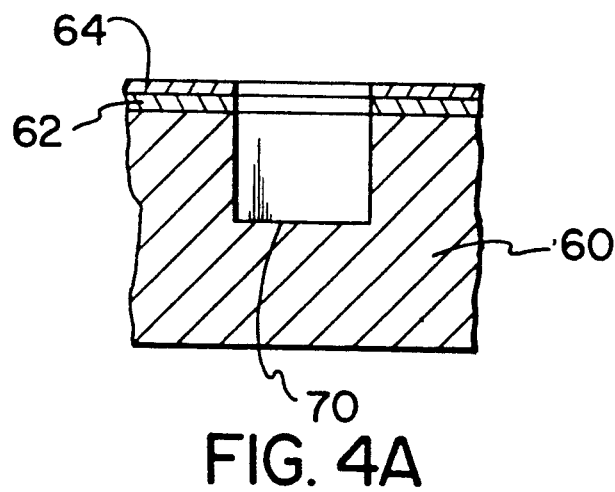
in FIGS. 4A, 5A, 6A, and 7A a first cross-sectional view; and in FIGS. 4B, 5B, 6B and 7B a second cross-sectional view at progressive steps in a method of forming a trench linear capacitor according to the first embodiment.
Figure 4B:
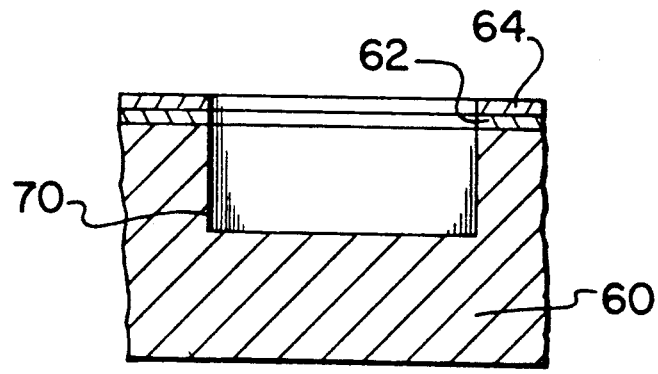

The selected area 66 of the substrate 60 is etched by an anisotropic etching process known in the industry, to a predetermined depth to form a deep, steep-sided trench 70. As an example, a trench may be provided by a known anisotropic etch comprising reactive ion etching of the silicon wafer substrate in a plasma generated from $CBrF_3$. The length and depth of the trench is selected according to the capacitance value required. The lateral dimension or width of the trench is wide enough to accommodate the selected thicknesses of each of the dielectric and conductive layers to be deposited in the trench, and in the example described below, the width of the first portion 72 is 3.5μm and the width of the narrower portion 74 is 1.5μm (FIG. 4).

Figure 5:
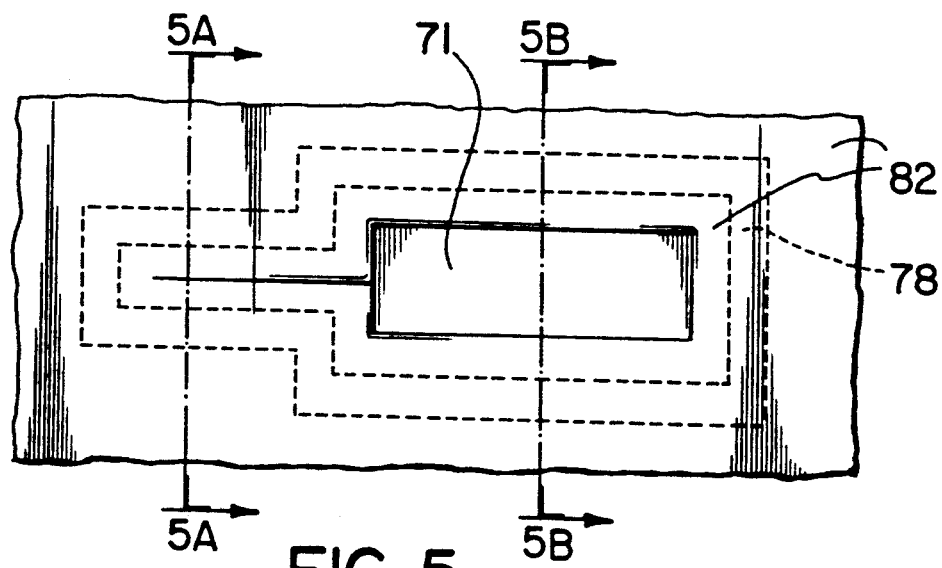
Figure 5A:
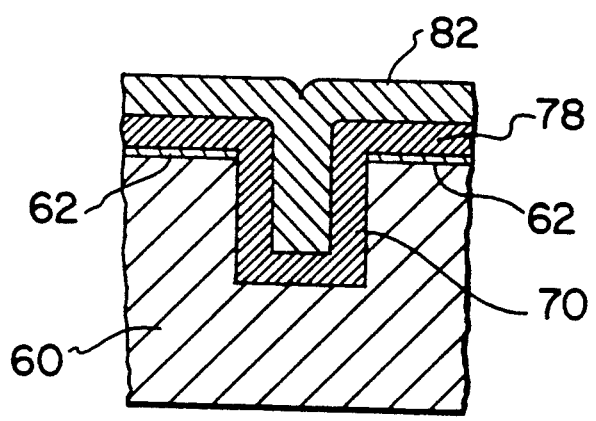
Figure 5B:
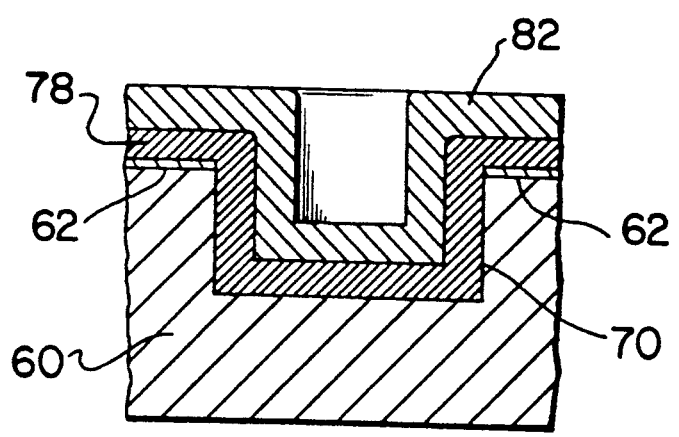

After formation of a steep-sided trench 70, the trench is cleaned in an HF solution which simultaneously removes the remaining trench etch mask layer of silicon dioxide 64, leaving only the layer 62 of silicon nitride exposed on the wafer surface all around the trench. A layer of a first dielectric 78 of, for example, ~400nm thickness of silicon dioxide is grown or deposited conformally overall so that the layer 78 of dielectric lines the sidewalls 73 and bottom 75 of the trench 70 and extends over the planar surface of the nitride layer 62 around the trench. A first conductive layer 82, for example, of a layer of conductive polysilicon is then deposited conformally over the substrate by an LPCVD (low pressure CVD) method known in the industry. The thickness of the polysilicon layer 82 is selected so that it completely fills the narrower portion 74 of the trench 70, as shown in cross-section in FIG. 5A, and the wider portion 72 of the trench remains partially unfilled, leaving a cavity 71 as shown in FIG. 5B. In this example, the conductive layer 82 is 350nm thick, phosphorus or boron doped polysilicon, as is typically used in the industry. The conductive layer 82 of polysilicon is, for example, formed by a conventional method of polysilicon CVD with in situ doping.

Figure 6:
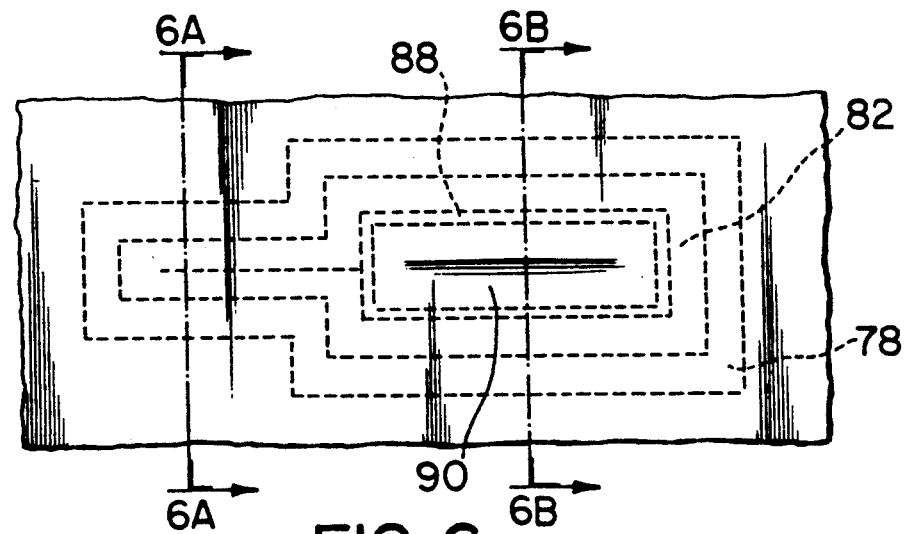
Figure 6A:
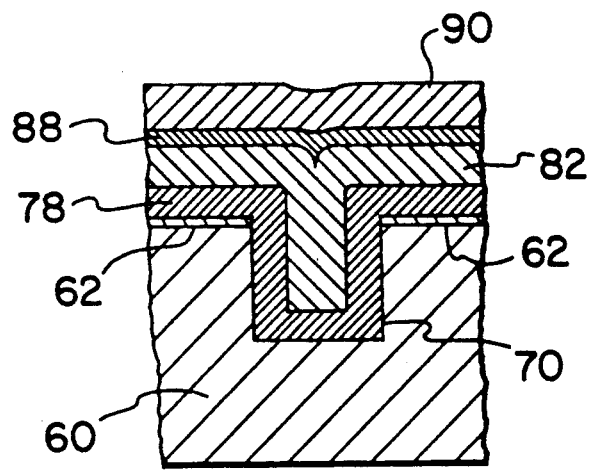
Figure 6B:
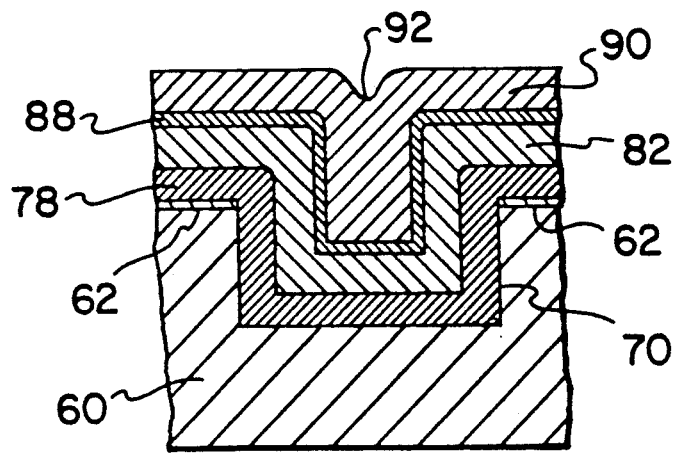

After deposition of the first polysilicon layer 82, a second dielectric layer 88, is grown or deposited conformally overall (FIG. 6). The second dielectric 88, composed of one or more electrically insulating materials forms the capacitor dielectric, and by way of example, is 30nm of silicon dioxide thermally grown at 950° C. by a known method. A second conductive layer 90, for example, of doped polysilicon, is deposited conformally over the dielectric layer 88. The thickness of the second conductive layer is such that it completely fills the remaining cavity in the wider portion 72 of the trench 70. The conformal polysilicon layer 90 may leave a depression 92 near the centre of the trench 70. The contour of this depression is dependent on the deposition thickness and trench width. Thus the narrower portion 72 is filled by the first dielectric layer and the first conductive layer only (FIG. 6A). The wider first portion 72 of the trench is filled by the dielectric layers 78 and 88 and conductive layers 82 and 90 (FIG. 6B). In this example, the wider portion 72 of the trench has a lateral dimension of twice the sum of the combined thicknesses of the conductive polysilicon and oxide dielectric layers and the narrow portion is not wider than twice the combined thicknesses of the first polysilicon and first dielectric layers. The first and second dielectric layers isolate the first and second conductive electrodes within the trench, each of these layers 78, 88, 82 and 90 extending over the planar surface of the silicon nitride layer 62 on the substrate 60 around the trench 70.

Figure 7:
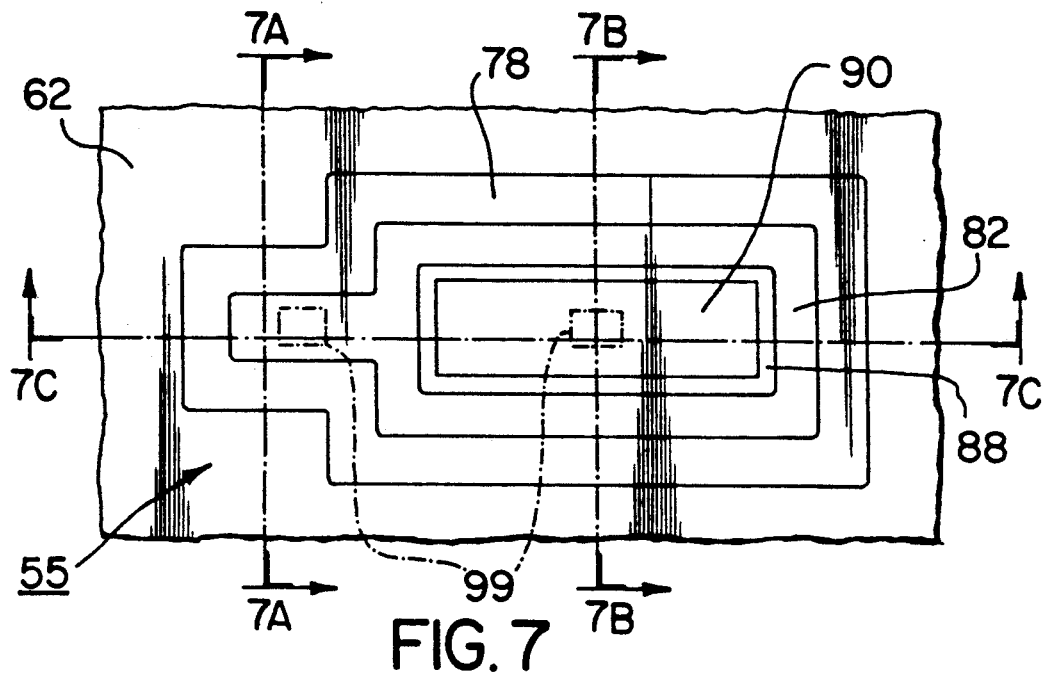
Figure 7A:
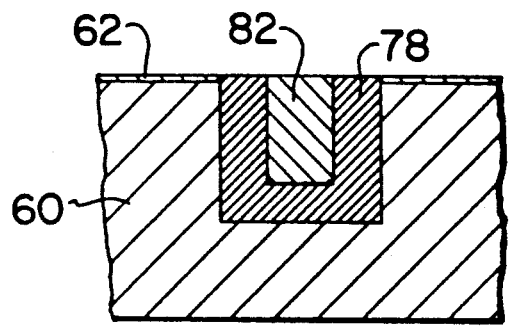
Figure 7B:
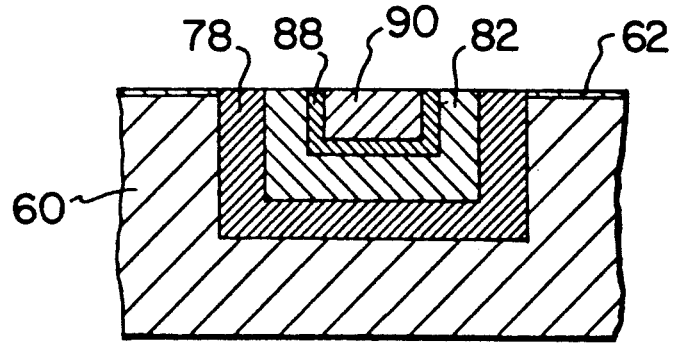
FIG. 7C shows a cross-sectional perspective view of the resulting structure shown in FIGS. 7, 7A and 7B.
Figure 7C:
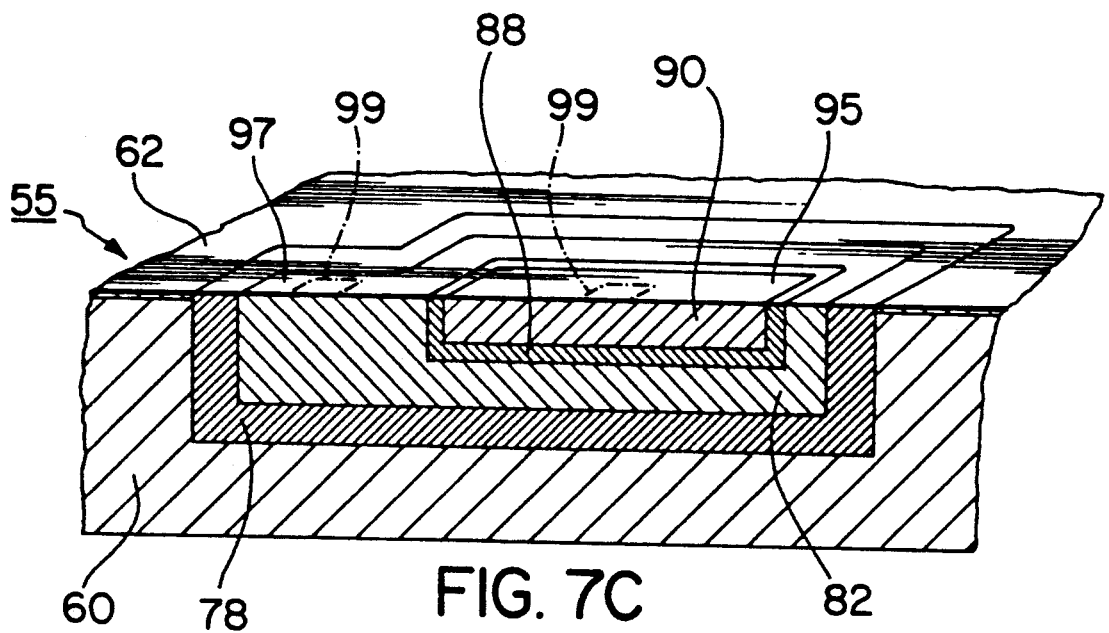

The resulting structure is then planarized by removing material of each of the layers of 90, 88, 82 and 78, extending above the planar surface of the protective layer 62 of silicon nitride (FIG. 7). Thus coplanar surfaces of each of the dielectric and conductive layers 90, 88, 82 and 78 are exposed substantially coplanar with the silicon nitride surface layer (FIGS. 7A and 7B). The first conductive polysilicon layer 82 forms the bottom electrode of the linear capacitor 55 (FIG. 7C). The narrow portion of the trench is completely filled with the first layer of polysilicon and provides a region having a surface cross-sectional area 97 large enough for defining thereon a contact to the bottom electrode 82. An area 95 for formation of a contact to the top electrode is provided on the exposed surface of the second polysilicon layer 90 (FIG. 7C) in the first region 72 of the trench.

A preferred method of planarization is removal of the surface layers by chemical-mechanical polishing, for example using a commercially available chemical-mechanical polishing solution of a silicon based slurry which selectively removes polysilicon layers 82 and 90 and silicon dioxide layers 78 and 88 relative to the masking layer of silicon nitride 62. The latter provides a relatively hard, etch resistant protective layer which functions as an etch stop. The resulting surface is thus fully planarized back to the level of the surface of the thin layer of silicon nitride (FIG. 7).

A top view of the resulting structure is shown in FIG. 7A. The wider portion of the trench has a central area of conductive material 90 which forms the top electrode of the linear capacitor 55. In the plan view of FIG. 7, the top electrode 90 is surrounded by a ring of dielectric material of layer 88, forming the capacitor dielectric, and a ring of conductive material of layer 82 forms the bottom electrode of the capacitor. The layer 82 is separated from the substrate 60 by dielectric layer 78. The narrower portion 74 of the trench contains an area of conductive material of layer 82 only, separated from the substrate by dielectric layer 78. FIGS. 7, 7A and 7B show a top view and cross-sectional views of the resulting structure including regions 99 of the conductive layers, for contacting the top and bottom electrodes. Electrical contacts to coplanar regions 99 are formed in subsequent processing steps by a known conventional method.

Thus the method provides for formation of two electrodes of a trench linear capacitor without the need for a photolithographic mask. Each electrode is formed from a conformal layer of polysilicon isolated by conformal layers of dielectric. Each conformal layer is thus effectively self-aligned within the trench region and masking steps for each electrode are not required. The trench isolated electrodes are formed in a maskless process and the number of processing steps is reduced.

Advantageously, coplanar areas for formation of contacts to each electrode are provided on a level planar with the surface of the substrate and a single planarization step is used to planarize each of the conductive and dielectric layers. Subsequent processing steps in small geometry, i.e. 0.5μm, device processes are simplified by the fully planarized topography.

The method according to the embodiment is compatible with bipolar and MOS processes which utilize trench isolation in CMOS and BiCMOS technologies.

A capacitor divider structure 120 according to a second embodiment of the invention is shown in FIG. 8. Similar reference numerals incremented by 100 are used in FIG. 8 as in FIGS. 3 to 7 to denote corresponding elements of the structures of the first and second embodiments. In plan view, FIG. 8, the capacitor divider structure 120 comprises two similar wider portions 171 and 172. Thus the capacitor structure of the second embodiment is similar in structure to two similar simple capacitor structures of the first embodiment joined through the narrow portion 174 extending between the two wider portions 171 and 172. The cross-sectional structures of the wider portion 171 and narrow portion 174 are shown in FIGS. 8A and 8B are similar to the first and second cross-sections of the capacitor of the first embodiment (FIGS. 7A and 7B). It will be clear from the similarity of elements of the capacitor structures of the first and second embodiments, that after defining a suitably shaped trench having wide portions 171 and 172 connected by a narrow portion 174, the capacitor divider structure according to the second embodiment is fabricated by a similar sequence of process steps as the capacitor of the first embodiment. The trench 170 is filled with a conformal first dielectric layer 178, a conformal first conductive polysilicon layer 182, filling the narrow portion and leaving a cavity in each of the wider portions 171 and 172 of the trench. A conformal second dielectric 188 and a conformal second polysilicon layer 190 are then provided in the remaining cavities to form an isolated electrode in each wide portion 171 and 172 of the trench 170. Thus a three electrode structure is formed by a maskless process.

Figure 9:
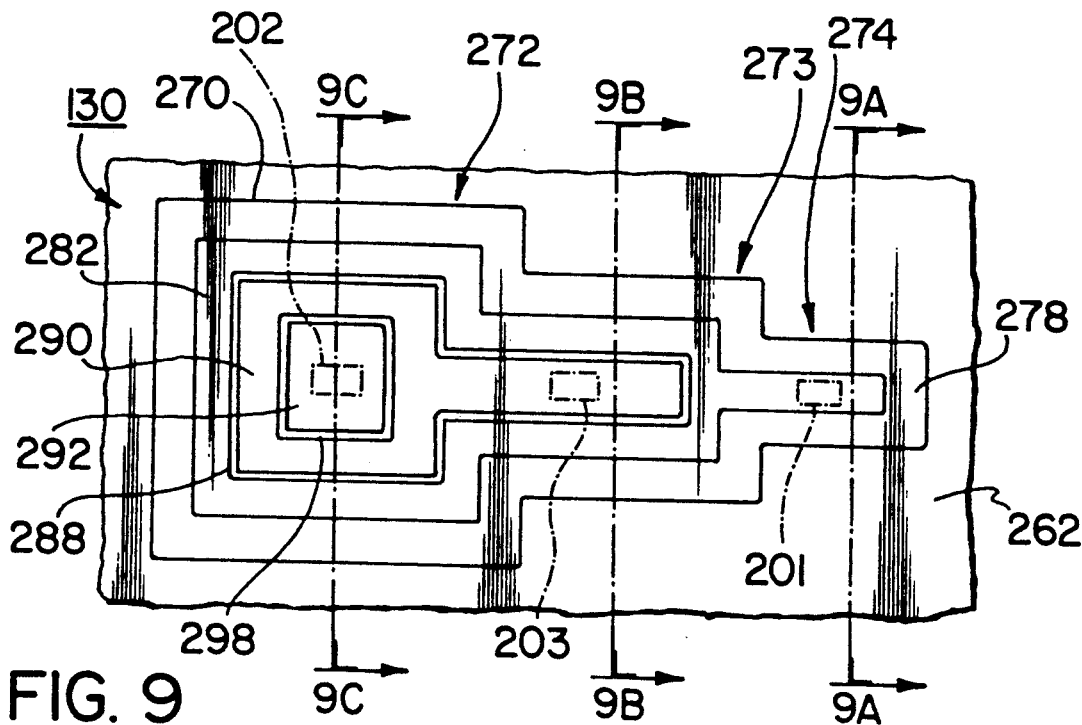
FIG. 9 shows a plan view and FIGS. 9A, 9B and 9C show respectively first, second and third cross-sectional views respectively of a capacitor structure according to a third embodiment of the present invention.
Figure 9A:
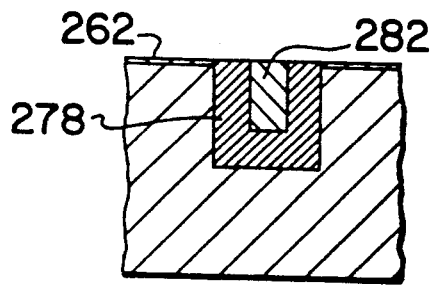
Figure 9B:
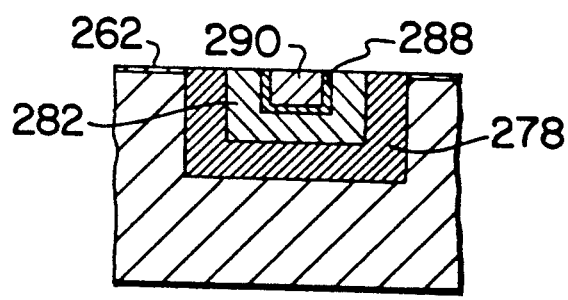
Figure 9C:
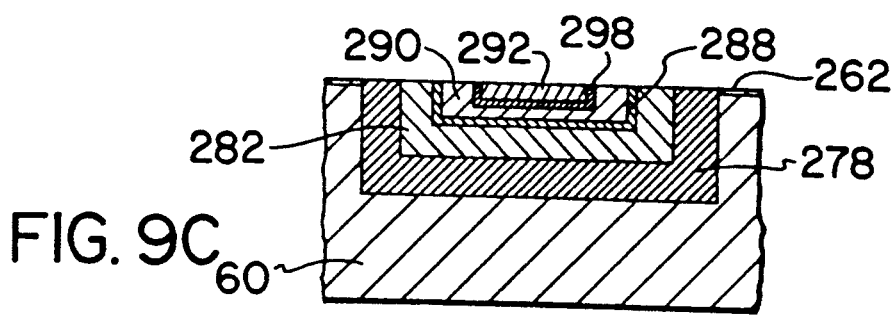
Figure 9D:
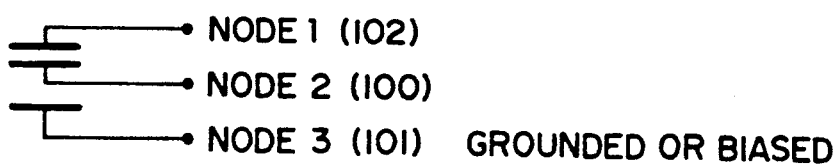
FIG. 9D an equivalent circuit diagram comprising a biased or grounded isolation capacitor structure.
Figure 9E:
FIG. 9E an equivalent circuit diagram comprising a reading or writing electrode for a memory capacitor, as representative applications of the structure according to a third embodiment of the present invention.

A biased or grounded isolation electrode structure 130 according to a third embodiment of the present invention is shown in plan view in FIG. 9 and in cross-section in FIGS. 9A and 9B. As shown in FIG. 9D, the structure comprises three electrodes. In a method of fabricating the structure, a trench 270 is defined which, as shown in plan view in FIG. 9, has a stepped structure comprising a narrow portion 274, an intermediate width portion 273 and a wide portion 272. In cross-section through narrow and wider portions 274 and 273, (FIGS. 9A and 9B respectively) the structure is similar to that of the narrow portion 74 and wide portion 72 respectively of the capacitor structure according to the first embodiment (FIGS. 7A and 7B). The structure 130 is provided by a similar sequence of processing steps to the first and second embodiments: after photoengraving and etching the stepped trench, conformal layers of a first dielectric 278, first conductive layer 282, second dielectric 288 and second conductive layer 292 are provided, as described above, except that the second conductive layer does not fill the trench 270. After deposition of the second conductive layer 290, a cavity remains in the wide portion 272 of the trench. A conformal layer of thin third dielectric 298 is then deposited to line the remaining cavity in the wide portion 272 of the trench, and a conformal third conductive layer, i.e. another layer of conductive polysilicon 292 is deposited to fill the wide portion 272 of the trench. After planarization of the resulting structure by a known method, such as chemical-mechanical polishing as described in the first embodiment, the cross-section through the wide portion 272 is as shown in FIG. 9C. The resulting structure may function, for example, as an isolation electrode, e.g. as in an equivalent circuit as illustrated in FIG. 9D, or as a reading or writing electrode for a memory capacitor (RAM, ROM, EPROM) as represented in FIG. 9E. Thus a three electrode capacitor structure is provided by a maskless process, a photo-lithographic process step being required only for defining the trench.

It will be apparent from the embodiments described that other trench structures having a plurality of electrodes for capacitors and other integrated circuit devices may be provided within the scope of the invention by modifying or varying the process steps of the embodiments. Since each layer filling the trench is conformal, each electrode and each inter-electrode dielectric layer is in effect self-aligned within the trench, and the structure of each electrode is dependent on the geometry of the trench. Photo-lithographic steps are not required to define each electrode, and consequently a single planarization step only is required after filling the trench with a plurality of conductive and dielectric layers. The number of mask levels used for complex analog BiCMOS process can be reduced. Furthermore, the process allows for formation of a capacitor at the initial stages of processing, while retaining wafer planarity.

In modifications of the embodiments of the invention, the dielectric layer of silicon dioxide is formed compositely by thermal oxidation following deposition. Alternatively, other known insulating materials are used instead of CVD silicon dioxide, for example, a layer of silicon nitride or silicon oxynitride formed by a known method of oxidation, thermal oxidation or an ONO (oxynitride oxide) process; or a metal oxide such as tantalum pentoxide.

Conductive polysilicon is provided alternatively by deposition of polysilicon followed by ion implantation of dopant to provide conductive polysilicon of a desired resistivity. Alternative conductive materials which may be used to form electrodes include metals which may be deposited to form a conformal layer, for example CVD tungsten. In the latter example a suitable dielectric layer may be provided by high pressure oxidation of tungsten to form tungsten oxide.

The chemical-mechanical polish stop layer alternatively comprises other hard polish resistant materials, for example, silicon carbide. Since the polish stop material must be more polish resistant than the conductive or insulating layers, silicon carbide is advantageous when the conductive material is a hard metal, for example, tungsten.

Other conventional etch back methods for planarization, for example, reactive ion etching may be used. However, planarization by chemical-mechanical polishing is particularly advantageous in providing a fully planarized surface topography. Coplanar contact to two or more electrodes can then be made thus simplifying subsequent process steps and reducing topography related photo-engraving and etch problems in defining conductive interconnect structures, particularly for deep submicron (i.e. ˙0.5μm) technology.

What is claimed is:

1. A method of forming trench isolated electrodes of a capacitor structure for an integrated circuit, comprising:
   providing a substrate having a planar surface defining therein a trench having sidewalls and a bottom, the trench having a first portion and a narrower portion of smaller lateral dimension;
   providing a conformal layer of dielectric material over the sidewalls and the bottom of the trench, the dielectric layer leaving a cavity within the trench;
   providing a conformal layer of a conductive material overlying the dielectric layer the thickness of the conductive layer being sufficient to completely fill the narrower portion of the trench and a part of said cavity remaining unfilled in the first portion of the trench;
   filling the trench by providing within the trench subsequent conformal layers comprising at least another conformal dielectric layer and an overlying conformal conductive layer; and
   planarizing the resulting structure by removal of material of each of the conformal layers extending above the planar surface of the substrate to expose surfaces of each of said layers within the trench substantially coplanar with the substrate surface whereby each conductive layer forms one of a plurality of trench isolated electrodes.

2. A method according to claim 1 wherein filling the trench comprises providing a conformal second dielectric layer and an overlying conformal second conductive layer only.

3. A method of forming electrodes of a trench linear capacitor for an integrated circuit comprising:
   providing a substrate having a planar surface and defining therein a trench having sidewalls and a bottom, the trench having a first portion and a narrower portion of smaller lateral dimension;
   providing a conformal first dielectric layer extending over the sidewalls and the bottom of the trench;
   providing a conformal first conductive layer overlying the first dielectric layer, the first conductive layer being sufficiently thick so that the narrower portion of the trench is completely filled with the first conductive layer, and part of said cavity remains in the first portion of the trench;
   providing a conformal second dielectric layer overlying the first conductive layer in said cavity;
   providing a conformal second conductive layer over the second dielectric layer, the second conductive layer being sufficiently thick to fill said cavity remaining in the trench; and
   planarizing the resulting structure by removal of layers extending above the planar surface of the substrate, to expose substantially coplanar surfaces of the first and second conductive layers, the first and second conductive layers thereby providing trench isolated first and second electrodes, and the exposed surfaces of the second conductive layer in the first portion of the trench and of the first conductive layer in the narrower portion of the trench thereby providing planarized areas sufficiently large for defining electrical contacts thereon.

4. A method according to claim 1 or claim 3 wherein the planar surface of the substrate is provided with chemical-mechanical polish resistant layer thereon, and the step of planarizing the resulting structure comprises chemical-mechanical polishing to remove conductive and dielectric layers extending above the polish resistant layer.

5. A method according to claim 1 or claim 3 wherein a protective layer is provided on the planar surface of the substrate around the trench before the step of providing the conformal layer of the first dielectric material, and the step of planarizing the resulting structure comprises selectively removing conductive layers and dielectric layers extending above the protective layer.

6. A method according to claim 3 comprising a further step of providing an electrical contact to the exposed surface of the first conductive layer in the narrower portion of the trench and to the exposed surface of the second conductive layer in the first portion of the trench.

7. A method according to claim 1 or claim 3 wherein providing a conductive layer comprises chemical vapour deposition of doped polysilicon.

8. A method according to claim 1 or claim 3 wherein the stop of providing an insulating layer comprises formation of a layer of a material selected from the group consisting of silicon dioxide, silicon nitride, and silicon oxynitride.

9. A method according to claim 1 or claim 3 wherein providing a conductive layer comprises chemical vapour deposition of a metal comprising tungsten.

10. A method for forming electrodes of a trench capacitor structure for an integrated circuit, comprising:
   providing a substrate having a planar surface and defining therein a trench, the trench having sidewalls and a bottom;
   providing a conformal first dielectric layer extending over the sidewalls and the bottom of the trench;
   providing a conformal first conductive layer overlying the first dielectric layer within the trench;
   providing a conformal second dielectric layer overlying the first conductive layer within the trench;
   providing an overlying conformal second conductive layer within the trench; and
   planarizing the resulting structure by removal of each of said dielectric layers and conductive layers extending above the planar surface of the substrate, to expose substantially coplanar surfaces of each layer within the trench.

11. A method according to claim 10 wherein sidewalls of the define therebetween a first portion and a narrower portion of smaller lateral dimension, and wherein the step of providing a first conductive layer fills the narrower portion of the trench and leaves a cavity within the first portion of the trench.

12. A method according to claim 11 wherein providing the second dielectric layer and the second conductive layer fills said cavity within the first portion of the trench.

13. A method according to claim 11 wherein providing the second dielectric layer and the second conductive material partially fills said cavity within the first portion of the trench and before planarizing the resulting structure, the method includes the steps of providing another conformal layer of dielectric and providing another conformal layer of conductive material to fill said cavity within the first portion of the trench.

14. A method according to claim 10 wherein the planar surface of the substrate comprises a protective layer of chemical-mechanical polish resistant material and the step of planarizing the resulting structure comprises chemical-mechanical polishing.

15. A method according to claim 10 wherein the planar surface of the substrate comprises a protective layer and wherein planarizing the resulting structure comprises selectively removing the dielectric layers and the conductive layers relative to the protective layer.

16. A method according to claim 12 wherein after the step of planarizing, the method comprises a further step of forming an electrical contact on the exposed surface of each of the first and second conductive layers.

17. A method according to claim 12 wherein after the step of planarizing, the method comprises forming a first electrical contact on the surface of the first conductive layer within the narrower portion of the trench and forming a second electrical contact on a coplanar area on the surface of the second conductive layer within the first portion of the trench.

18. A method according to claim 10 wherein providing a conformal conductive layer comprises chemical vapour deposition and doped polysilicon.

19. A method according to claim 10 wherein providing a dielectric layer comprises formation of a layer of material selected from the group consisting of silicon dioxide, silicon nitride, and silicon oxynitride.

20. A method according to claim 10 wherein the step of providing a trench comprises:
  providing a protective layer on the substrate surface;
  providing an overlying substrate etch masking layer;
  patterning of the protective layer and the substrate etch masking layer to expose a selected area of the substrate; and
  anisotropically etching the selected area of the substrate to form said trench having sidewalls and a bottom.

* * * * *